(12) United States Patent
Mizuno et al.

(10) Patent No.: US 7,810,705 B2
(45) Date of Patent: Oct. 12, 2010

(54) APPARATUS AND METHOD FOR SUPPLYING ELECTRICALLY CONDUCTIVE MATERIAL

(75) Inventors: Toru Mizuno, Tokyo (JP); Kazuaki Takanuki, Tokyo (JP); Tatsuya Wagou, Tokyo (JP)

(73) Assignee: TDK Corporation, Tokyo (JP)

( * ) Notice: Subject to any disclaimer, the term of this patent is extended or adjusted under 35 U.S.C. 154(b) by 361 days.

(21) Appl. No.: 11/854,222

(22) Filed: Sep. 12, 2007

(65) Prior Publication Data
US 2008/0073413 A1    Mar. 27, 2008

(30) Foreign Application Priority Data
Sep. 25, 2006  (JP)  ............................. 2006-258733

(51) Int. Cl.
*B23K 35/12*    (2006.01)
(52) U.S. Cl. .................. 228/260; 228/248.1; 228/33
(58) Field of Classification Search ............... 228/33, 228/248.1, 260
See application file for complete search history.

(56) References Cited
U.S. PATENT DOCUMENTS 6,543,677 B2 *  4/2003  Pattanaik et al. ............ 228/246
6,823,581 B2    11/2004  Kidachi et al.
7,121,449 B2 *  10/2006  Zakel et al. ................. 228/102
2004/0069758 A1  4/2004  Azdasht et al.

FOREIGN PATENT DOCUMENTS

| JP | 2002-170351 | 6/2002 |
|---|---|---|
| JP | 2004-534409 | 11/2004 |
| WO | WO 03/006197 A1 | 1/2003 |

* cited by examiner

*Primary Examiner*—Jessica L Ward
*Assistant Examiner*—Nicholas P D'Aniello
(74) *Attorney, Agent, or Firm*—Oblon, Spivak, McClelland, Maier & Neustadt, L.L.P.

(57) ABSTRACT

In a conductive material supply apparatus that can connect a small slider electrode and a wiring electrode on a flexure in a miniaturized magnetic head, electrically conductive material is supplied, with the aid of flow of nitrogen gas that is pressurized to a first pressure, into the interior of a nozzle assembly that defines an interior space having a nozzle orifice through which the electrically conductive material can pass. After the electrically conductive material has been supplied, the flow of the nitrogen gas is stopped, and the interior space is temporarily brought into communication with the exterior space thereby decreasing the pressure in the interior space. Thereafter, nitrogen gas maintained at a second pressure that is designed to be lower than the first pressure is supplied to the interior space, whereby the electrically conductive material is ejected to the exterior from the nozzle orifice by the effect of the second pressure.

7 Claims, 9 Drawing Sheets

APPARATUS AND METHOD FOR SUPPLYING ELECTRICALLY CONDUCTIVE MATERIAL

BACKGROUND OF THE INVENTION

1. Field of the Invention

The present invention relates to an electrically conductive material supply apparatus and method for supplying a ball of an electrically conductive material such as solder to a predetermined position to electrically connecting a plurality of electrodes or the like.

2. Related Background Art

For example, a process of manufacturing a magnetic head includes a step of connecting an electrode provided on a so-called magnetic head core and an end of an electrical wire on a so-called gimbal that supports the core. According to a known technique directed to such a process, a ball of an electrically conductive material is supplied to a position near the electrode and the wire end to establish electrical connection therebetween via that ball, as disclosed in, for example, Japanese Patent Application Laid-Open No. 2002-170351. In this method, a solder ball is used as the electrically conductive material, and in order to separate many balls that are stored together in a portion from each other, use is made of a disk-like member provided with a plurality of through holes that are arranged at a certain distance from the rotation center with regular angular intervals. When the disk-like member is rotated, solder balls get into the through holes and are separated and transferred one by one. The through holes are in communication with ball transfer passages and the balls fall in the transfer passage by their own weight, whereby each ball moves to a predetermined supply position. The ball at that supply position is irradiated with a laser beam to melt, whereby electrical connection is established between the electrode and the wire end. In this method, the transfer passages also serve as passages for supplying nitrogen gas that is supplied to prevent oxidation of solder balls. The nitrogen gas helps transfer of the solder ball to the supply position.

In recent years, the size of magnetic heads has been made smaller and their structure has been made more complex with reduction in the size and improvement in the performance of magnetic recording apparatuses (or hard disk drives (HDD)) in which the magnetic heads are used. The diameter of the solder ball has also been reduced significantly with reduction in the size of the magnetic head, and in the case of the method disclosed in the aforementioned Japanese Patent Application Laid-Open No. 2002-170351 it is difficult to hold the ball at a predetermined position between the electrode and the wire end with reliability. A solution to the above described problem is disclosed in Japanese Patent Application Laid-Open No. 2004-534409. According to the method disclosed in this publication, a holder that stores a solder ball in the interior space provided therein is provided with a small opening for supplying a solder ball, and the solder ball is held on the opening in such a way as to stop the opening. The holder that is holding the solder ball in this way is positioned without being in contact with the electrode, and then the solder ball is melted by laser irradiation while the pressure in the interior of the holder is increased, so that the molten solder ball is ejected from the opening and the molten solder is attached to a prescribed position on the electrode.

SUMMARY OF THE INVENTION

In the structure disclosed in Japanese Patent Application Laid-Open No. 2004-534409 also, use is made of a rotary disk having through holes similar to that disclosed in Japanese Patent Application Laid-Open No. 2002-170351 to transfer solder balls individually, wherein the solder balls are transferred to the laser irradiation position by their own weights with the aid of nitrogen gas. In this structure, the interior space of the holder is substantially sealed by the solder ball. The nitrogen gas is supplied into the interior space in this state, whereby the pressure in the interior space is increased to enable ejection of the molten solder ball. With reduction in the size and arrangement pitch of electrodes along with reduction in the size of magnetic heads or other parts, the diameter of solder balls used has been reduced to about 60 µm. Solder balls of such a small size cannot be transferred satisfactorily if they are driven mainly by gravity, since they tend to adhere to the rotary disk due to electrostatic force. Therefore, it is necessary to assist the transfer by nitrogen gas flow with a significantly large flow rate. In addition, it is required to transfer the solder ball quickly to the holder opening in order to achieve high operation speed. To this end also, it is necessary to supply nitrogen gas with a significantly large flow rate.

However, the pressure in the interior space of the holder that is achieved when the flow rate of the nitrogen gas supplied is maintained at the aforementioned level is not equal to the pressure that is actually required to eject the molten solder ball. Specifically, the pressure in the interior space becomes excessively higher than the required ejection pressure. Particularly, when the transfer speed of the solder ball is to be increased, a significant difference between these pressures results. The nitrogen gas can flow out of the interior space through gas flow-out paths formed by the presence of the space in which the rotary disk is accommodated and the presence of a rotation mechanism of the disk etc, or through a gap at the holder opening stopped by the solder ball. Accordingly, the pressure in the interior space can be easily lowered to the ejection pressure by temporarily stopping supply of the nitrogen gas at the time when transfer of the solder ball is considered to have been completed. However, the additional time taken to lower the pressure deteriorates the operation efficiency. Furthermore, in cases where supply of the nitrogen gas is stopped as described above, it is difficult, in fact, to control the ejection pressure precisely, since the nitrogen gas can flow out through various flow paths.

In the structure disclosed in Japanese Patent Application Laid-Open No. 2002-170351 also, transfer of the solder ball to a prescribed position on an electrode is assisted by nitrogen gas. In this structure also, if there is a difference between the actual flow rate of the nitrogen gas supplied at the time when transfer of the solder ball is assisted and the flow rate of the nitrogen gas at the time when the solder ball is held at a bonding position, a time delay caused in changing the flow rate from the former to the latter will cause a problem. In this structure, although supply of nitrogen gas is advantageous in that the nitrogen gas prevents oxidation of the molten solder, the molten state of solder can be unstable to cause variations in bonding strength of fusing solder in cases where the nitrogen gas supply quantity is too large or unstable. Furthermore, in the case where timing of melting the solder ball by irradiation with a laser beam is controlled based on the transfer time so that, for example, irradiation with laser is performed at the time when or just before the solder ball comes to a prescribed position on an electrode, melting of the solder ball is hardly performed at an appropriate position if the flow rate or pressure of the nitrogen gas that assists transfer of the solder ball is unstable.

The present invention has been made in view of the above described situations. The present invention is directed to an apparatus and method for supplying electrically conductive material such as a small-diameter solder ball in an apparatus that supplies the electrically conductive material to a prescribed position to electrically connecting plurality of electrodes together and has as an object to provide an apparatus and method that enable to control a pressure for supplying (or ejecting) the electrically conductive material to a prescribed position precisely in order to enable to transfer the electrically conductive material quickly to a prescribed holding position from which it is supplied. Another object of the present invention is to enable to supply the electrically conductive material quickly to a prescribed connecting or bonding position and to supply a specific gas stably to the electrically conductive material melted at that position and to enable to melt the electrically conductive material stably at the prescribed position, irrespective of the molten or solid state of the electrically conductive material to be supplied to that position.

To achieve the above object, according to the present invention, there is provided a conductive material supply apparatus for ejecting electrically conductive material to a prescribed portion between a plurality of electrodes and solidifying it to thereby electrically connect the plurality of electrodes, comprising a nozzle assembly having a nozzle orifice through which the electrically conductive material is caused to pass and an interior space that constitutes a substantially sealed space when the nozzle orifice is substantially closed by the electrically conductive material, heating means for heating the electrically conductive material to melt it, a conductive material supply portion that transfers the electrically conductive material to the interior space with the aid of flow of a first gas that is pressurized to a first pressure, a gas supply system that supplies a second gas that is pressurized to a second pressure into the interior space, and a valve member through which the first gas with which the interior space is filled can be discharged from the interior space to an exterior space.

In the above described supply apparatus, it is preferred that the heating means have a heating ray source that emits heating ray and a heating ray transmitting member that can transmit the heating ray, wherein the heating ray transmitting member constitutes a part of a wall that defines the interior space. It is preferred that the above described supply apparatus further comprise a block member disposed at the nozzle orifice, wherein the block member creates a substantially closed state in which the electrically conductive material cannot pass through the nozzle orifice and an open state. In the above described supply apparatus, it is preferred that the valve member have a release valve that can be controlled to be opened and closed. In this case, it is preferred that the supply apparatus further comprise a supply apparatus control unit that controls timing of stopping flow of the first gas while supplying the electrically conductive material, timing of starting to supply the second gas and timing of opening/closing the release valve. Alternatively, it is preferred that the valve member in the supply apparatus comprise a needle valve that allows the first gas to flow out through the valve member at a specific flow rate and can be kept open always.

To achieve the above object, according to the present invention, there is provided a conductive material supply method for ejecting electrically conductive material to a prescribed portion between a plurality of electrodes and solidifying it to thereby electrically connect the plurality of electrodes, comprising transferring the electrically conductive material to an interior space of a nozzle assembly with the aid of flow of a first gas that is pressurized to a first pressure, the nozzle assembly having a nozzle orifice through which the electrically conductive material is caused to pass and the interior space that constitutes a substantially sealed space when the nozzle orifice is substantially closed by the electrically conductive material, bringing, after the electrically conductive material has been transferred into the interior space, the interior space into communication with an exterior space, and supplying a second gas that is pressurized to a second pressure into the interior space, closing the nozzle orifice substantially with the electrically conductive material with supply of the second gas being continued, thereby achieving a pressure close to the second pressure in the interior space, and ejecting the electrically conductive material to the prescribed portion by the effect of the second pressure.

In the above described supply method, it is preferred that the state in which the nozzle orifice is substantially closed by the electrically conductive material be achieved by stopping transfer of the electrically conductive material by a block member that prevents the electrically conductive material from passing through the nozzle orifice, and when the electrically conductive material is ejected to the prescribed portion, the block member allow the electrically conductive material to pass through the nozzle orifice. In the above described supply method, it is preferred that the step of bringing the interior space into communication with the exterior space comprise the step of opening a release valve connected to the interior space, and when supplying the second gas, the release valve is closed. Alternatively, in the above described supply method, it is preferred that communication between the interior space and the exterior space be established by a needle valve connected to the interior space with which the flow rate of the gas flowing from the interior space to the exterior space can be controlled, and the needle valve be kept in an open state in which a constant gas flow rate is maintained both at the time when the first gas flows into the interior space and at the time when the second gas is supplied to the interior space. It is preferred that the first gas and the second gas be inert gas.

The present invention enables to transfer a ball of an electrically conductive material having a small diameter quickly to a prescribed holding position in a holder. The present invention enables to control the ejection pressure precisely and easily in actually melting and ejecting electrically conductive material to supply it to a prescribed position. This enables to connect smaller electrodes. According to the present invention, upon ejecting electrically conductive material after transferring it to a prescribed position in a holder, the pressure in the interior space of the holder can be changed to a prescribed pressure easily by a simple structure. Furthermore, since the pressure can be changed quickly, time taken in connecting electrodes can be reduced significantly.

According to the present invention, the flow rate of inert gas such as nitrogen gas supplied to electrically conductive material can be made stable whether the electrically conductive material is melted in the interior or exterior of the nozzle. Thus, a specific molten state of the electrically conductive material can be achieved every time.

BRIEF DESCRIPTION OF THE DRAWINGS

FIG. 1A illustrates the general structure of a conductive material supply apparatus according to a first embodiment of the present invention. FIG. 1A includes an axial cross sectional view of the principal portion of the apparatus.

FIG. 4 illustrates the general structure of a conductive material supply apparatus according to a second embodiment of the present invention. FIG. 4 includes an axial cross sectional view of the principal portion of the apparatus.

FIG. 6 illustrates the general structure of a conductive material supply apparatus according to a third embodiment of the present invention. FIG. 6 includes an axial cross sectional view of the principal portion of the apparatus.

DESCRIPTION OF THE PREFERRED EMBODIMENTS

First Embodiment

Figure 1A:
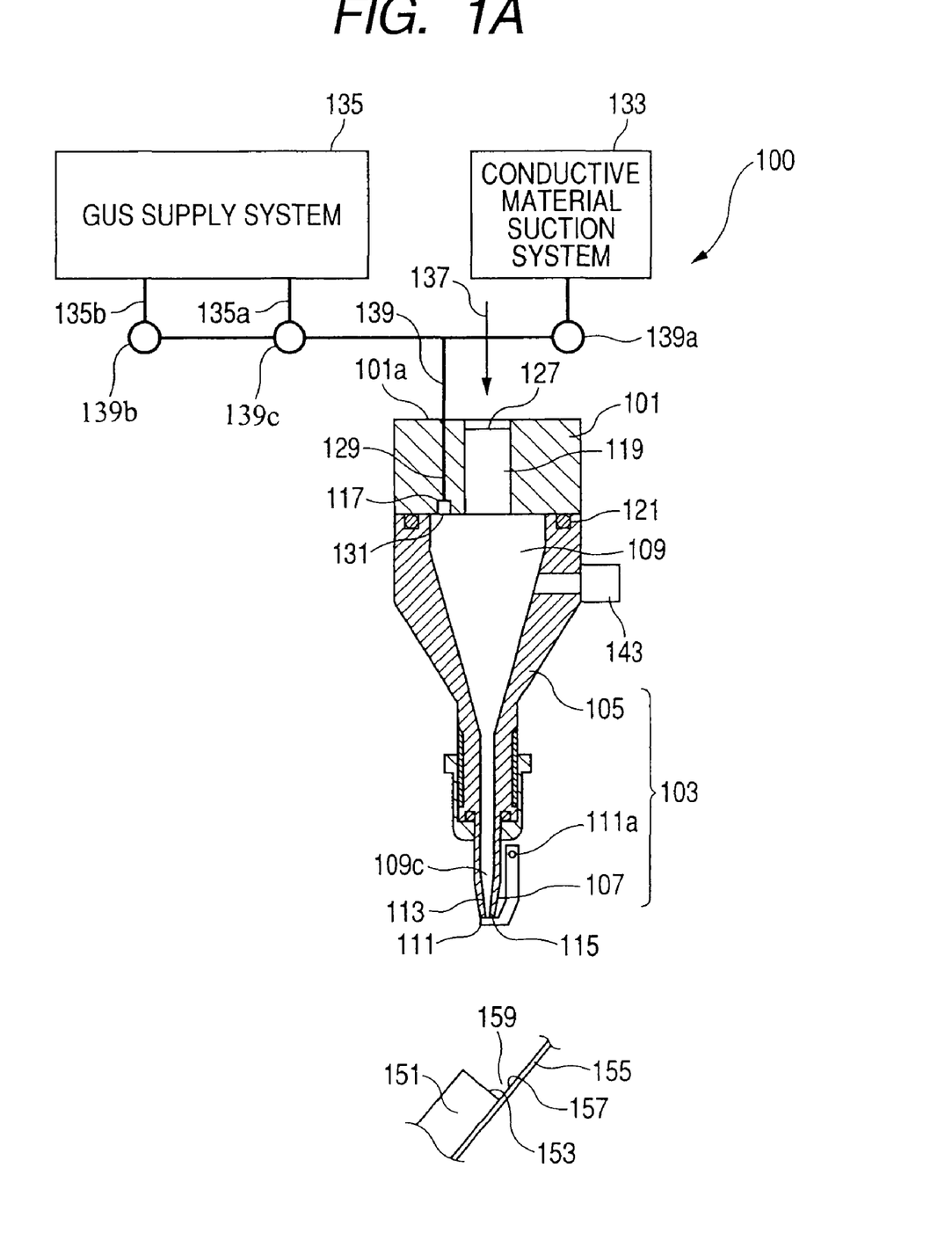
Figure 1B:
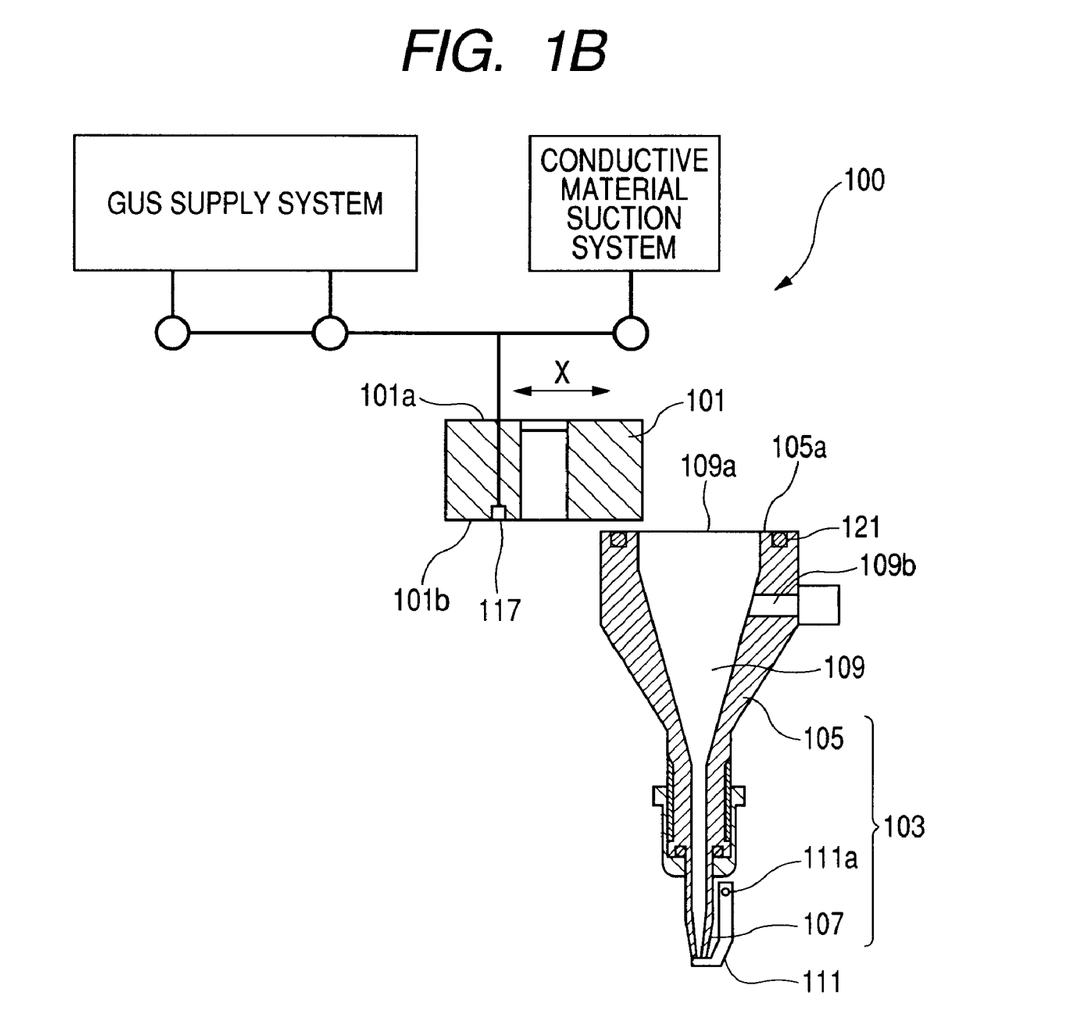
FIG. 1B schematically shows the apparatus shown in FIG. 1A in a state in which electrically conductive material is supplied into the apparatus.

In the following, an embodiment of the present invention will be described with reference to the accompanying drawings. FIGS. 1A and 1B schematically show the general structure of an apparatus for supplying an electrically conductive material according to a first embodiment of the present invention. FIGS. 1A and 1B include axial cross sections of the main body of the conductive material supply apparatus. The conductive material supply apparatus includes a main body 100 of the supply apparatus, a conductive material suction system 133, a gas supply system 135 and a heating ray emitting apparatus (not shown) that supplies heating ray 137. The main body 100 of the supply apparatus has a conductive material supply portion 101 and a nozzle assembly 103. In the following, these elements and the relationship between the elements will be described in detail.

The conductive material supply portion 101 has a substantially cylindrical shape and is provided with a heating ray passage 119 and a suction and gas supply passage 129. The heating ray passage 119 is an axial through bore formed in the conductive material supply portion 101 having a substantially cylindrical shape. The through bore is closed by a heating ray transmitting member 127 on one end surface (i.e. upper surface) 101a of the conductive material supply portion 101 that is different from the end surface facing to the nozzle assembly 103. The heating ray transmitting member 127 is made of, for example, a glass plate that can transmit heating rays 137 such as laser beams. A heating ray 137 such as a laser beam is emitted from the heating ray source 138 (see FIG. 2), passing through an optical system (not shown) that is provided if needed, then transmitted by the heating ray transmitting member 127, and then passing through the heating ray passage 119, and irradiates a ball of an electrically conductive material ejected from the nozzle assembly 103.

The suction and gas supply passage 129 is passing through from the upper surface 101a to the region on the end surface (or lower surface) 101b opposed to the nozzle assembly 103 that faces the interior space 109 (which will be described later) of the nozzle assembly 103 to allow gas communication between the interior space 109 and a space on the upper surface 101a side. The suction and gas supply passage 129 is connected to a gas flow passage 139 composed, for example, of a tube at its opening at the upper surface 101a. At the opening of the suction and gas supply passage 129 at the lower surface 101b, there is provided a recessed portion 131 having an inner shape that can receive only one lump of electrically conductive material that is supplied in a substantially spherical shape (i.e. as a ball). For example, the recessed portion 131 may be a cylindrical recess having a inner diameter and a depth that are slightly larger than the diameter of the ball. The outer peripheral portion of the end surface (lower surface) 101b of the conductive material supply portion 101 that is opposed to the nozzle assembly 103 is mirror-finished and cooperates with an O-ring 121 provided on the nozzle assembly 103 to form a substantially sealed space as will be described later.

The gas flow passage 139 branches into three lines, which are connected to a conductive material suction system 133, a lower pressure gas flow passage 135a and a higher pressure gas flow passage 135b via a first open/close valve 139a, a second open/close valve 139b and a third open/close valve 139c respectively. The conductive material suction system 133 is composed, for example, of an open/close valve and a vacuum pump. When the conductive material suction system 133 is brought into communication with the gas flow passage 139 by opening the first open/close valve 139a and closing the second and third open/close valves 139b, 139c, a suction force is created in the recessed portion 131 by gas evacuation through the gas flow passage 139 and the suction and gas supply passage 129. The gas supply system 135 has two lines of gas supply passages including the higher pressure gas flow passage 135b through which gas is caused to flow at a first pressure and the lower pressure gas flow passage 135a through which gas is caused to flow at a second pressure. When the second open/close valve 139c connected to the lower pressure gas flow passage 135a is opened and the first and second open/close valves 139a, 139b are closed, a specific gas pressurized by the gas supply system 135 to a prescribed pressure that is higher than the atmospheric pressure and lower than the pressure of the gas supplied to the higher pressure gas flow passage 135b described later is supplied to the gas flow passage 139. When the second open/close valve 139b connected to the higher pressure gas flow passage 135b is opened and the first and second open/close valves 139a, 139b are closed, a gas pressurized to a prescribed high pressure can be supplied to the gas flow passage 139.

The nozzle assembly 103 includes a nozzle body 105, a nozzle 107, a release valve 143, a shutter 111 and an O-ring 121. The nozzle body 105 has a substantially conical shape with a flat surface (or the upper surface 105a) facing the conductive material supply portion 101 and has an interior space 109 having a substantially conical shape passing through from the flat surface (upper surface 105a) to the apex. The center axis of the interior space 109 coincides with the center axis of the heating ray passage 119 that defines the cylindrical inner circumferential surface of the conductive material supply portion 101 in the state in which the nozzle assembly 103 and the conductive material supply portion 101 are coupled together in a prescribed positional relationship. The opening 109a of the interior space 109 at the upper surface 105a is large enough that the recessed portion 131 at the inner space 109 side opening of the suction and gas supply passage 129 is encompassed by the region defined by the opening 109a of the interior space 109 in the state in which the nozzle assembly 103 and the conductive material supply portion 101 are coupled together.

The circumference of the upper surface 105a side opening 109a of the interior space 109 is defined by a flat surface, on which an O-ring 121 is provided in such a way as to surround the opening 109a. In the state in which the nozzle assembly 103 and the conductive material supply portion 101 are coupled together, the O-ring 121 achieves a seal between the mirror-finished portion on the lower surface 101b of the conductive material supply portion 101 and the upper surface 105a of the nozzle body 105, so that the interior space 109 and the heating ray passage 119 constitute a substantially closed space. The interior space 109 further includes a leak passage 109b that can communicate with the exterior of the nozzle assembly 103 at its lateral side. The leak passage 109b is provided with the release valve 143. By opening the release valve 143, the gas in the interior of the substantially closed interior space 109 can be exhausted to the exterior space.

The nozzle 107 has a through bore 113 having a substantially cylindrical shape that passes through along the axial direction. The nozzle 107 is attached to the apex of the substantially conical nozzle body 105 in such a way that the opening 109c at the conical apex of the interior space 109 of the nozzle body 105 and the through bore 113 are coaxially in communication with each other. The aperture diameter of the conical apex opening 109c of the interior space 109 and the inner diameter of the through bore 113 are designed to be larger than the diameter of the electrically conductive material of a spherical or ball-like shape supplied by the main body 100 of the supply apparatus. The opening 115 at the other end of the through bore 113 (i.e. the end opposite to the end connected to the nozzle body 105) serves as a supply opening in supplying the electrically conductive material to a prescribed position, namely a nozzle orifice through which the electrically conductive material can pass. In this embodiment, the aperture diameter of the nozzle orifice 115 is designed to be slightly larger than the diameter of the aforementioned ball of the electrically conductive material. The shutter 111 includes a member that can project onto or to the neighborhood of the nozzle orifice 115 to narrow the aperture of the nozzle orifice 115. The shutter 111 can be swung about a pivot 111a in the plane of the drawing sheet of FIGS. 1A and 1B by a drive system that is not shown in the drawings, and it is adapted to close the nozzle orifice 115 by its end portion at one end of its swing movement. The shutter 111 functions as a block member that narrows the aperture of the nozzle orifice 115 thereby preventing the electrically conductive material from passing through the nozzle orifice 115 and opens the aperture thereby allowing the electrically conductive material to pass through the nozzle orifice 115. The axis of the through bore 113 that is in communication with the interior space 109 is oriented substantially vertically with the orifice 115 being disposed downside. Consequently, the electrically conductive material supplied into the interior space 109 falls toward the orifice 115 by its own weight and abuts the shutter 111 that narrows or substantially closes the orifice 115, whereby it is stored or held in the through bore 113. Thus, the through bore 113 functions as a storage portion 113 for the electrically conductive material.

Figure 2:
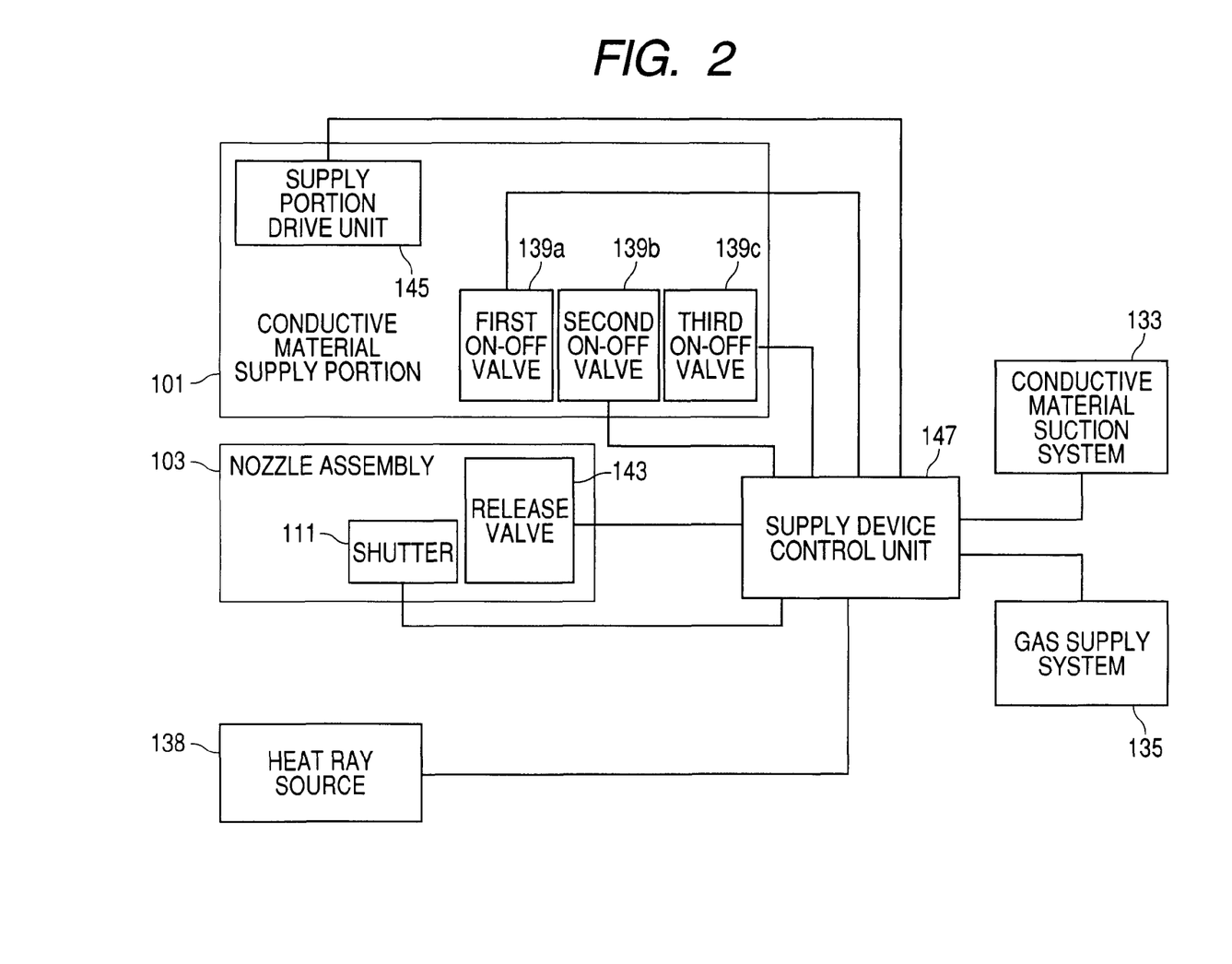
FIG. 2 is a block diagram schematically showing the general configuration of the conductive material supply apparatus according to the first embodiment of the present invention.

In the following, the conductive material supply apparatus including the above described main body 100 of the supply apparatus will be described with reference to a block diagram that schematically shows the actual configuration of the apparatus. FIG. 2 is a block diagram of the supply apparatus 1 for supplying electrically conductive material according to an embodiment of the present invention. The conductive material supply portion 101 has a supply portion drive unit 145 for attaching/detaching the supply portion 101 to/from the nozzle assembly 103. The supply portion drive unit 145 has the first open/close valve 139a, the second open/close valve 139b and the third open/close valve 139c. The nozzle assembly 103 has a release valve 143 on a control block and the shutter 111. The supply portion drive unit 145, the first open/close valve 139a, the second open/close valve 139b, the third open/close valve 139c, the release valve 143, the heating ray source 138, the conductive material suction system 133 and the gas supply system 135 are connected with a supply apparatus control unit 147. The supply apparatus control unit 147 controls, among others, timing of sequential operations of the supply portion drive unit 145, the first open/close valve 139a, the second open/close valve 139b, the third open/close valve 139c, the release valve 143 and the heating ray source 138 at a time when the conductive material is pressed to a prescribed position.

Figure 3:
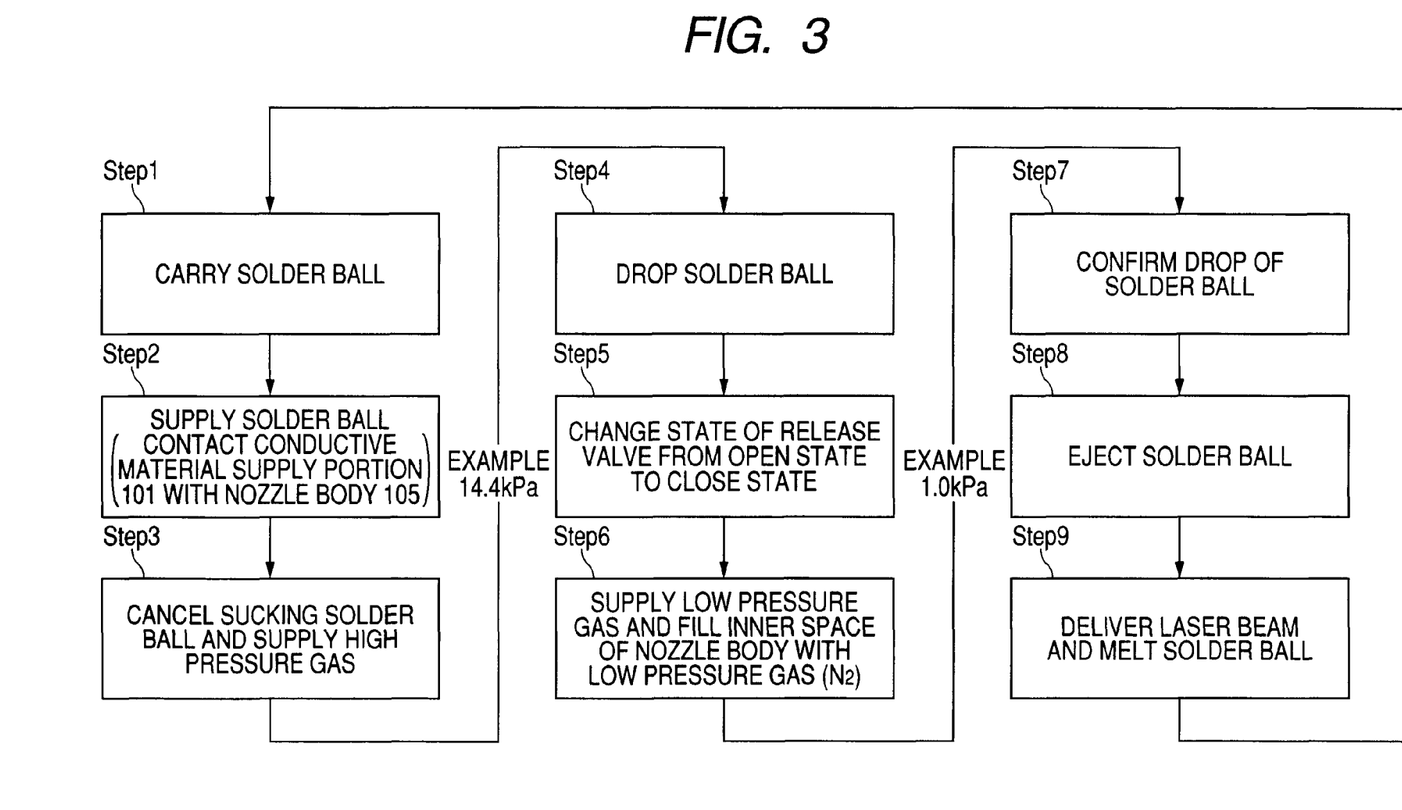
FIG. 3 is a flow chart of a specific process of supplying electrically conductive material according to the first embodiment of the present invention.

A control process of the supply portion drive unit 147 as an embodiment of the conductive material supply method according to the present invention will be described in the following with reference to FIGS. 1A, 1B, 2 and 3, where FIG. 1B illustrates a state in which the conductive material supply portion 101 has been detached from the nozzle assembly 103, in a manner similar to FIG. 1A, FIG. 2 is a block diagram and FIG. 3 is a flow chart of a conductive material supply process. In this embodiment, the electrically conductive material is a solder, which is generally used. As shown in FIG. 1A, electrodes to be connected or bonded are assumed to be a slider electrode 153 of a magnetic head slider 151 in what is called a magnetic head and a wiring electrode 157 provided on what is called a flexure 155 that supports the magnetic head slider 151, by way of example. When the solder is supplied, the slider electrode 153 and the wiring electrode 157 are disposed side by side and the plane of the slider electrode 153 and the plane of the wiring electrode 157 form an angle of 90 degrees, as shown in FIG. 1A. These electrodes are positioned in such a way that the center axis of the nozzle 107 (or the axis of solder supply) intersects the line of intersection of the aforementioned two planes and passes through the intersection point of the line connecting the centers of these electrodes and the aforementioned line of intersection. The electrodes to be connected are positioned at a prescribed position on the center axis of the nozzle 107 by driving the main body 100 of the supply apparatus and a mechanism that supports the magnetic head. However, the operation associated with the positioning of the electrodes will not be described in further detail.

In the actual operation of supplying the solder, the conductive material supply portion 101 is first driven by the supply portion drive unit 145 to a material storage system (not shown) in which many solder balls are stored. The driving of the conductive material supply portion 101 is stopped when it comes to a solder ball receiving position in the material storage system. At that position, the supply apparatus control unit 147 causes the first open/close valve 139a to open to thereby bring the suction and gas supply passage 129 into communication with the conductive material suction system 133. The conductive material suction system 133 is continuously performing evacuation operation (or suction generating operation), and when the communication between the suction and gas supply system 129 and the conductive material suction system 133 is established, a suction force is generated in the receiving recessed portion 131 provided in the conductive material supply portion 101. The receiving recessed portion 131 has a size corresponding to one solder ball 117 and receives and holds only one solder ball 117 on which the suction force can act. The supply apparatus control unit 147 controls the first open/close valve 139a to keep the above described state, and causes the supply portion drive unit 145 to drive the conductive material supply portion 101 to a coupling position above the nozzle assembly 103 via the state shown in FIG. 1B (step 1).

After the conductive material supply portion 101 has been stopped at the prescribed position above the nozzle assembly 103, the heating ray passage 119 and the interior space 109 are connected together while being sealed from the exterior space by the O-ring to constitute a substantially sealed space. In this state, the substantially sealed space is in communication with the exterior space only through the nozzle orifice 115 (step 2). The supply apparatus control unit 147 closes the first open/close valve 139a to disconnect the suction and gas supply passage 129 and the conductive material supply suction system 133. By this operation, the suction force in the receiving recessed portion 131 is disabled. At that time, the third open/close valve 139c is opened, whereby the gas flow passage 139 is brought into communication with the higher pressure gas flow passage 135b of the gas supply system 135 simultaneously. By the above described operation, high pressure gas is supplied to the receiving recessed portion 131 from the gas supply system 135. The high pressure gas is supplied from the bottom (i.e. the upper side in FIG. 1A) of the receiving recessed portion 131 substantially toward the nozzle orifice 115 (step 3).

The solder ball 117 in the receiving recessed portion 131 is pushed by the high pressure gas thus supplied and falls toward the nozzle orifice 115 (step 4). As described above, it is considered that a solder ball having a diameter of, for example 60 μm may not get out of the receiving recessed portion 131 only by the gravity acting thereon, since a relatively strong electrostatic force is acting on the solder ball. In addition, while the solder ball is falling in the interior space 109 toward the nozzle orifice 115, there is a possibility that the falling speed is decreased by interaction with the inner surface of the interior space 109 or other reasons. By supplying high pressure gas from the bottom of the receiving recessed portion 113 in the above described manner in this embodiment, the solder ball 117 can be detached from the receiving recessed portion 131 promptly. Furthermore, since the high pressure gas supplied into the substantially closed space flows towards the nozzle orifice 115, the solder ball 117 is carried by the flow of the high pressure gas and carried toward the nozzle orifice 115 at high speed. Accordingly, the solder ball 117 can be delivered to the nozzle orifice 115 at a higher speed as compared to the case where the solder ball is transferred only by the gravity acting thereon under the absence of attracting electromagnetic force.

After a specific time has elapsed since operation of the third open/close valve 139c, the supply apparatus control unit 147 opens the release valve 143. At the same time, the third open/close valve 139c is closed and the second open/close valve 139b is opened, whereby the gas supply passage is switched to the lower pressure gas flow passage 135a. In synchronization with the switching of the gas supply passage, operation of closing the release valve 143 is also performed (step 5). With the above described valve operations, the pressure in the substantially closed space including the interior space 109 and the heating ray passage 119 increases to a pressure close to the high pressure gas supply pressure (in this embodiment, a pressure higher than the atmospheric pressure by approximately 14.4 kPa) and then decreases steeply down to a pressure close to the low pressure gas supply pressure (step 6). While the above described operations are performed, the solder ball 117 is transferred until its movement is blocked by the shutter 111 and it is caught at the nozzle orifice 115. When the solder ball 117 is held in the receiving portion 113 in the above described state, the sealing of the substantially sealed space including the interior space 109 and the heating ray passage 119 is significantly enhanced. Consequently, the pressure in the substantially sealed space changes to a pressure close to the supply pressure of the low pressure gas supplied into that space (in this embodiment, a pressure higher than the atmospheric pressure by approximately 1.0 kPa) and becomes stable at that pressure. The holding status of the solder ball 117 at the nozzle orifice 115 may be checked by detecting the pressure by, for example, a pressure sensor that is not shown in the drawing (step 7).

The above described pressure state is maintained by maintaining the state in which the gas flow passage 139 is connected to the lower pressure gas flow passage 139a with the first and third open/close valves 139a and 139c being closed and only the second open/closed valve 139b being open. While maintaining this pressure state, the supply apparatus control unit 147 causes the shutter 111 to operate to bring the nozzle orifice 115 into a state that allows the solder ball 117 to pass. Since the pressure in the closed space including the heating ray passage 119 and the interior space 109 is higher than the atmospheric pressure, the solder ball 117 is ejected from the nozzle orifice 115 to the outside by the pressure difference (step 8). By controlling the pressure difference between the atmospheric pressure and the pressure in the sealed space, the solder ball 117 can be ejected in a prescribed direction at a prescribed speed. Just after the ejection of the solder ball 117, the supply apparatus control unit 147 activates the heating ray source 138 to irradiate the solder ball 117 in the held state with a heating ray (or a laser beam, in this embodiment) through the heating ray transmitting member 127, the heating ray passage 119, the conical apex opening 109c of the interior space 109, the through bore 113 and the nozzle orifice 115. Irradiated with the heating ray, the solder ball 117 is melted or substantially melted (step 9).

More specifically, the solder ball 117 ejected from the nozzle orifice 115 is supplied to a prescribed position 159 just below the nozzle orifice 115 at which it can be in contact with both the slider electrode 153 and the wiring electrode 157. The solder ball 117 is once melted by the heating ray, then comes into electrical contact with both the electrodes, and then solidifies (ejection solidification), whereby connection of the electrodes is completed. After completion of the above described operation, the supply apparatus control unit 147 opens the first open/close valve 139a thereby connecting the suction and gas supply passage 129 to the conductive material suction system 133 and closes the second open/close valve 139b and the third open/close valve 139c to shut down the communication between the gas flow passage 139 and the gas supply system 135. Simultaneously, the supply apparatus control unit 147 causes the supply portion drive unit 145 to operate to drive the conductive material supply portion 101 to the solder ball receiving position in the aforementioned material storage system (not shown). Simultaneously, electrodes to be connected next are placed at a prescribed position just below the nozzle assembly 103. Then, the above described process sequence is performed again, whereby the electrodes are connected.

Second Embodiment

Figure 4:
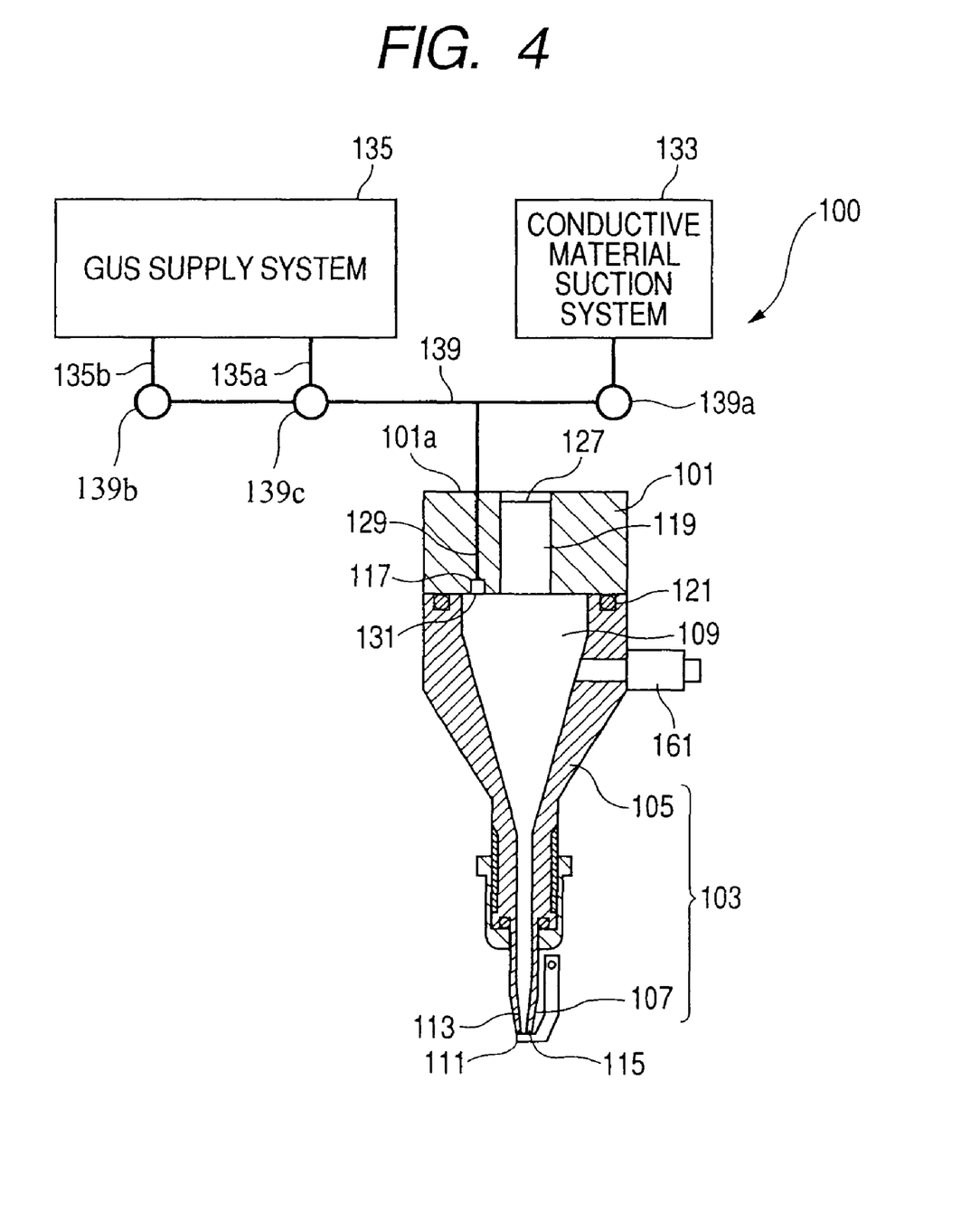

In the following, a supply apparatus according to a second embodiment of the present invention will be described. FIG. 4 schematically illustrates the general structure of the apparatus in the same manner as FIG. 1A. In the following description, elements having functions the same as those shown in FIG. 1A are denoted by the same reference signs. In the following, only portions that are different from those in the first embodiment will be described. In the embodiment shown in FIG. 4, the release valve 143 in the embodiment shown in FIG. 1A has been replaced by a needle valve 161 that always allows the gas to flow therethrough at a certain flow rate. Accordingly, the supply apparatus control unit 147 controls the first open/close valve 139a, the second open/close valve 139b and the third open/close valve 139c, but does not control the needle valve 161.

Figure 5:
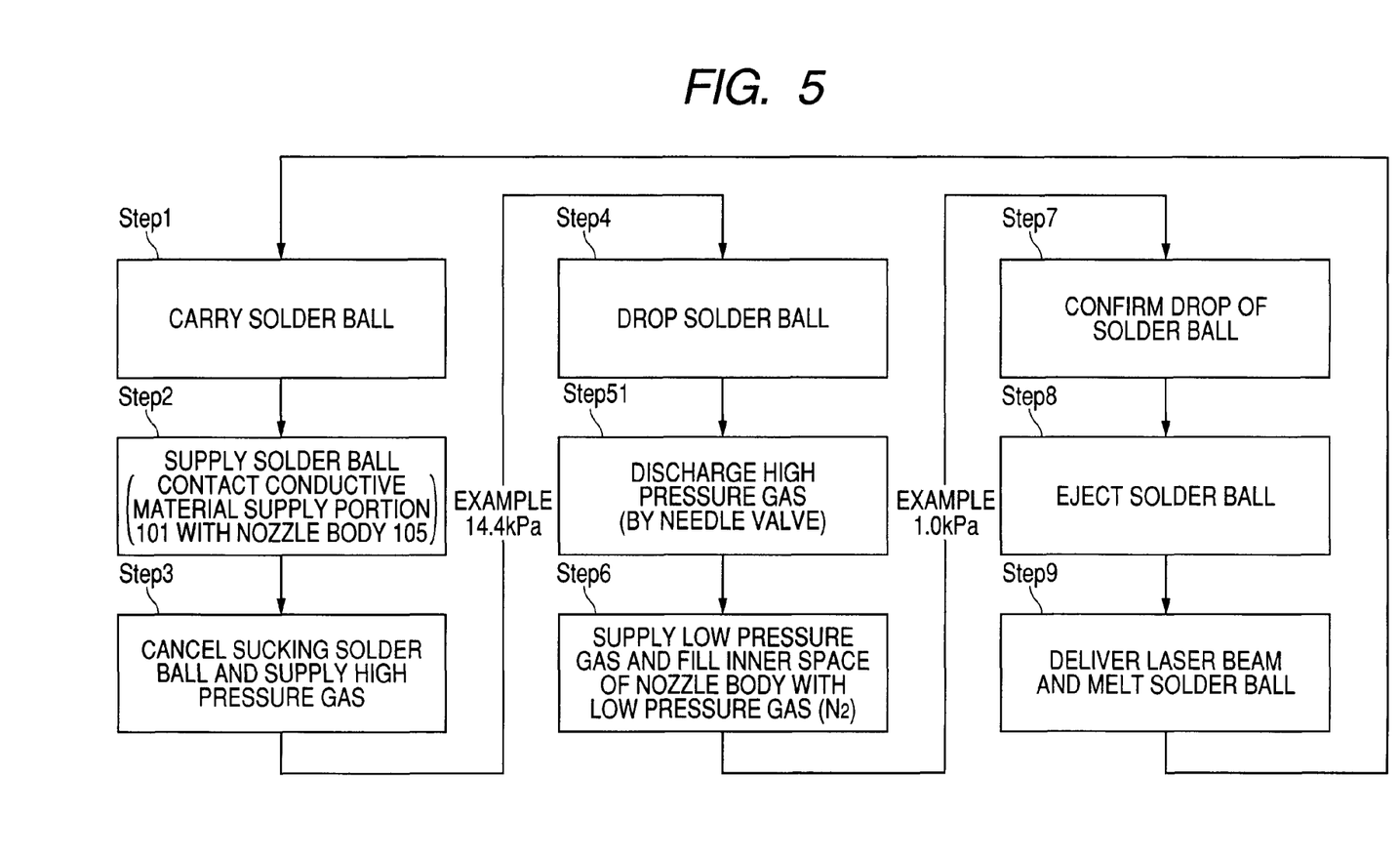
FIG. 5 is a flow chart of a specific process of supplying electrically conductive material according to the second embodiment of the present invention.

In the following, the solder ball supply process in the supply apparatus according to the second embodiment will be described with reference to the flow chart of FIG. 5 that has the same format as FIG. 3. The process steps in which the same operations as the process steps in the flow chart of FIG. 3 are denoted by the same step numbers as in FIG. 3, and a description thereof will be omitted. In the second embodiment of the present invention shown in FIG. 5, an operation of step 51 is executed in place of the operation of opening and closing the release valve 143 in step 5 in the flow chart of FIG. 3. Specifically, the gas supply from the gas supply system 135 into the substantially sealed space including the heating ray passage 119 and the interior space 109 is switched from the gas supply through the higher pressure gas flow passage to the gas supply through the lower pressure gas flow passage in a state in which the apparatus is arranged in such a way that the flow rate of the gas flowing from the substantially closed space to the exterior space through the needle valve 161 is constant.

Although in this embodiment it is possible to adjust the flow rate of the gas flowing from the substantially sealed space to the exterior space through the needle valve 161, automatic control for opening/closing the needle valve 161 is not performed by the supply apparatus control unit 147 or other units. According to this embodiment, by adjusting the flow rate of gas discharged through the needle valve 161, a set pressure can be easily achieved in association with the flow rate of the supplied gas. However, to achieve a prescribed pressure, the flow rate of the discharged gas cannot be made excessively large. For this reason, the time taken to achieve an appropriate pressure state suitable for ejection of the solder ball is larger as compared to the case of the first embodiment. However, since the opening/closing operation of the needle valve can be eliminated, the structure of the apparatus can be made more simple, and the load on the supply apparatus control unit 147 can be lightened.

Third Embodiment

Figure 6:
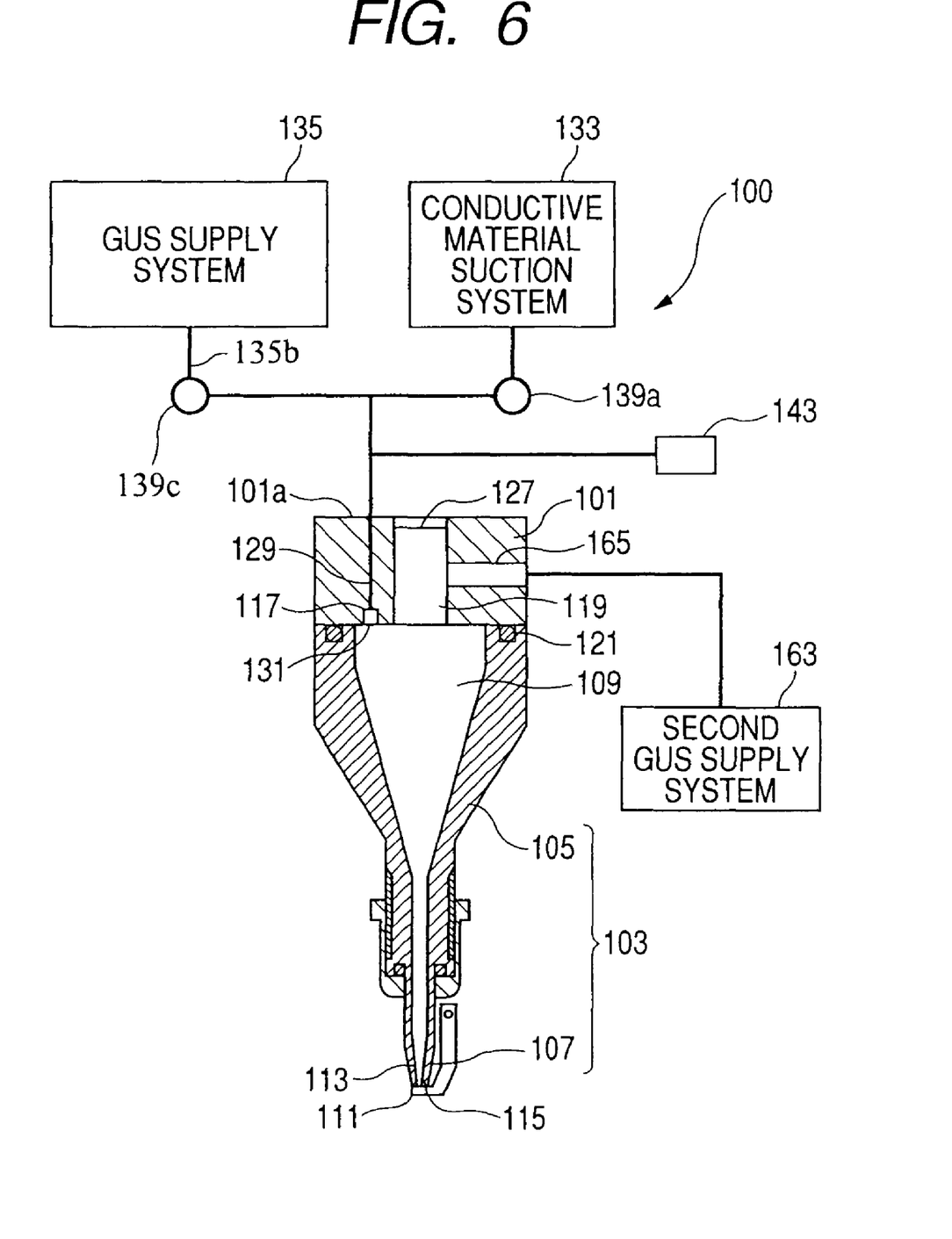

In the following, a supply apparatus according to a third embodiment of the present invention will be described. FIG. 6 schematically illustrates the general structure of the apparatus in the same manner as FIG. 1A. In the following description, elements having functions the same as those shown in FIG. 1A are denoted by the same reference signs. In the following, only portions that are different from those in the first embodiment will be described. In the embodiment shown in FIG. 6, the lower pressure gas flow passage 135a and the second open/close valve 139b connected thereto in the embodiment shown in FIG. 1A have been eliminated. The passage for supplying low pressure gas in the first embodiment has been removed from the gas supply system 135, and low pressure gas is supplied from a second gas supply system 163, which is not present in the first embodiment. The second gas supply system 163 is connected to the substantially sealed space including the heating ray passage 119 and the interior space 109 through a second gas supply passage 165 that is different from the suction and gas supply passage 129. Although in the embodiment shown in FIG. 6 the second gas supply passage 165 is provided in the conductive material supply portion 101, it may be provided in the nozzle assembly 103, alternatively. Although the release valve 143 is provided for the gas flow passage 139 in this embodiment, it may be provided for the suction and gas supply passage 129 provided in the conductive material supply portion 101. The supply apparatus control unit 147 is configured to control the operations of the first open/close valve 139a, the third open/close valve 139c and release valve 143 and the gas supply operation in the second gas supply system 163.

Figure 7:
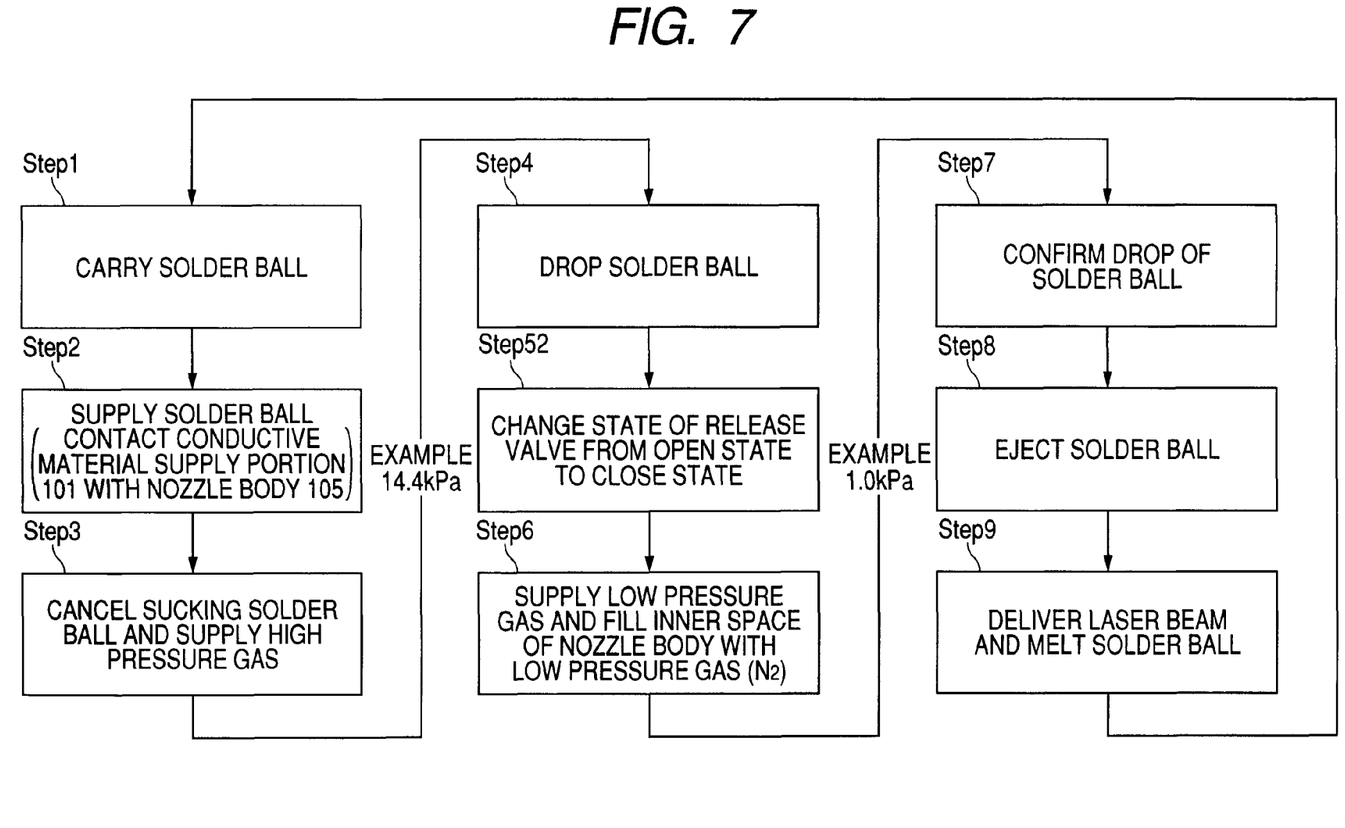
FIG. 7 is a flow chart of a specific process of supplying electrically conductive material according to the third embodiment of the present invention.

In the following, the solder ball supply process in the supply apparatus according to the third embodiment will be described with reference to the flow chart of FIG. 7 that has the same format as FIG. 3. The process steps in which the same operations as the process steps in the flow chart of FIG. 3 are denoted by the same step numbers as in FIG. 3, and a description thereof will be omitted. In the third embodiment of the present invention shown in FIG. 7, an operation of step 52 is executed in place of the operation of opening and closing the release valve 143 in step 5 in the flow chart of FIG. 3. Specifically, in step 52 the supply apparatus control unit 147 causes the release valve 143 to open after a prescribed time has elapsed since the operation of the second open/close valve 139b. Simultaneously, the supply apparatus control unit 147 causes the second gas supply system 163 to operate to supply gas that is maintained at a certain low pressure into the interior space 109 through the second gas supply passage 165. In synchronization with this operation, the release valve 143 is closed again (step 52). By the above described valve operations, the pressure in the substantially closed space including the interior space 109 and the heating ray passage 119 is once rises to a pressure close to the supply pressure of the high pressure gas (a pressure higher than the atmospheric pressure by 14.4 kPa, in this embodiment), and then falls steeply to a pressure close to the supply pressure of the low pressure gas. The operation process of step 6 and the subsequent steps is the same as that in the first embodiment, and it will not be further described.

Generally, when gas is introduced through multiple passages at different pressures and the change in the pressure caused by the introduction of the gas is to be controlled precisely with good response characteristics, it is preferred that the lengths of the passages be made as short as possible. In other words, when gas is introduced through a valve into a space, the pressure in which is to be controlled, it is preferred that the valve be disposed as close to that space as possible. In the case of structure according to the first embodiment, to the conductive material supply portion 101, which is a movable unit, are attached the first open/close valve 139a, the second open/close valve 139b, the third open/close valve 139c, a gas pipe constituting the higher pressure gas flow passage 135b, a gas pipe constituting the lower pressure gas flow passage 135a and a pipe connected to the conductive material suction system 133. Accordingly, in this structure, there is a possibility that the movable range or the moving speed of the conductive material supply portion 101 is restricted by the piping. According to the third embodiment, a second switching valve that accompanies a pipe can be eliminated, and therefore, the driving of the conductive material supply portion 101 can be made easier, and the driving apparatus therefore can be made simple.

In the above described embodiment, the nozzle orifice 115 opens toward the vertically downward direction and the solder ball 117 is supplied in the vertically downward direction. However, the direction of supplying the solder ball 117 is not limited to the vertical direction, but it is preferable that the direction be modified according to the position of the electrodes to be connected, since according to the present invention the supply gas pressure in supplying the solder ball 117 can be controlled precisely, and the speed of the solder ball supplied can also be controlled precisely. In the above described embodiment, the shutter 111 is provided at the nozzle orifice to hold the solder ball 117 within the nozzle, and the solder ball 117 ejected out of the nozzle is melted by irradiation with heating ray and supplied to the electrodes to be connected. However, the present invention may also be implemented in such a manner that the aperture diameter of the nozzle orifice is designed to be smaller than the diameter of the solder ball and the solder ball in a state in which it stops or plugs the orifice is melted by irradiation with heating ray and then ejected to the electrodes to be connected. In this case also, the pressure in ejecting the molten solder can be controlled precisely, and advantageous effects similar to those of the above described embodiment can be achieved. Accordingly, the material that passes through the nozzle orifice 115 may preferably be defined as an electrically conductive material, whether in a solid state or a molten state. In the above described embodiment, the solder ball 117 is held in the vicinity of the nozzle orifice 115 by the shutter 111, and the diameter of the solder ball is designed to be smaller than the aperture diameter of the nozzle orifice. Therefore, when the solder ball is held at that position, the nozzle orifice is substantially closed, and the space leading to the nozzle orifice constitutes a substantially closed space.

In the above described embodiment, the conductive material supply portion 101 has been described, by way of example, as means for supplying a solder ball to a substantially sealed space that can hold it at an orifice. In this embodiment, the solder ball is supplied from the conductive material supply portion 101 to the interior space of the nozzle assembly 103 by its own weight while assisted by high pressure gas flow. However, the way of supplying an electrically conductive material to the substantially sealed space in implementing the present invention is not limited to the above described structure, but a ball made of an electrically conductive material may be carried in a pipe by a high pressure gas so as to be supplied to that space. The present invention can be applied to any apparatus in which an electrically conductive material is supplied to a substantially sealed space with the aid of a high pressure gas flow and then supplied onto an electrode to be connected from the substantially sealed space with a prescribed pressure. The present invention can also be applied to an apparatus in which an electrically conductive material is supplied onto a prescribed position on an electrode to be connected with the aid of high pressure gas flow, and low pressure gas flow is supplied onto the electrically conductive material upon melting and fusing it by irradiation with a heating ray such as a laser beam to prevent oxidation of the material. In this case, the present invention enables quick switching from the high pressure gas flow to the low pressure gas flow. As per the above, it is preferred in the present invention that the electrically conductive material in the form of a solder ball be transferred into an interior space 109 with the aid of gas flow at a high pressure or a first pressure. This is preferably performed by a conductive material supply portion.

Although the nozzle assembly 103 in the above descried embodiment is composed of a nozzle body 105 and a nozzle 107, the structure of the nozzle assembly to which the present invention can be applied is not limited to such a nozzle assembly. More specifically, the present invention can also be applied to any nozzle assembly that can hold electrically conductive material at an opening, form a substantially sealed space having the opening and irradiate the electrically conductive material with a heating ray. Although in the above described embodiment, a solder ball is used as ball made of an electrically conductive material by way of example, the material is not limited to a solder, but the ball may be made of various materials such as gold or a gold ball with a solder layer on its surface may also be used. Although the gas supplied from the gas supply system has not been specified, use of an inert gas such as nitrogen gas is preferable from the viewpoint of preventing oxidation upon melting the electrically conducing material and reducing the cost. When transferring the electrically conductive material, nitrogen gas with low purity may be used as the first gas, and when ejecting and solidifying the electrically conductive material, nitrogen gas with high purity may be used. It is preferred that the heating ray be a laser beam, which can be handled easily in an established way. Although in the above described embodiment, heating means for heating and melting the electrically conductive material includes a heating ray source and a heating ray transmitting member, the electrically conductive material may be heated by a heat source such as a heater provided in the vicinity of the nozzle orifice.

Figure 8:
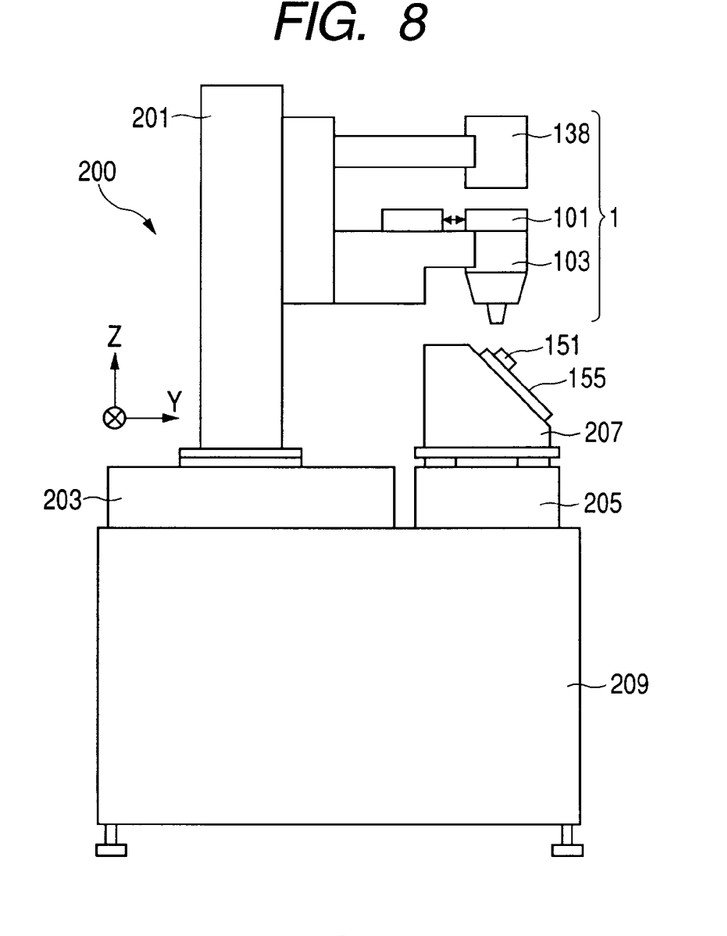
FIG. 8 is a side view schematically showing the general structure of an electrode bonding apparatus for a magnetic head according to an embodiment of the present invention.

In the following, an apparatus for connecting or bonding electrodes of a magnetic head equipped with the conductive material (or solder ball) supply apparatus according to the above described first embodiment will be described, by way of example, as an embodiment of the present invention. FIG. 8 is a side view schematically showing the general structure of an apparatus for bonding electrodes of a magnetic head. The electrode bonding apparatus 200 has a bonding head, or a supply apparatus 1 according to the present invention, a first head moving stage 201, a second head moving stage 203, a work moving stage 205, a work tray 207 and a base 209. The base 209 supports the second head moving stage 203 and the work moving stage 205 in the same plane that is maintained in a substantially horizontal state. The second head moving stage 203 is adapted to support the first head moving stage 201 and can drive it in the Y direction shown in FIG. 8 relative to the second head moving stage 203 by means of a known mechanism (not shown) including a linear slider, a motor, a ball screw and a ball screw seat etc.

The second head moving stage 203 is adapted to support the bonding head 1 and can drive it in the Z direction shown in FIG. 8 relative to the first head moving stage 201 by means of a known mechanism (not shown) including a linear slider, a motor, a ball screw and a ball screw seat etc. A laser emitting apparatus 138 serving as a heating ray source and the nozzle assembly 103 are in a fixed positional relationship so that the axis of the laser beam emitted from the laser emitting apparatus 138 is aligned with the center axis of the nozzle assembly 103 and the nozzle 107. The conductive material supply portion 101 is moved between the position indicated by alternate long and short dash line and the position indicated by solid line, whereby a solder ball is supplied to the interior space 109 of the nozzle assembly 103.

The work moving stage 205 is adapted to support the work tray 207 and can drive it in the X direction shown in FIG. 8 (i.e. the direction perpendicular to the plane of the drawing sheet) relative to the work moving stage 205 by means of a known mechanism (not shown) including a linear slider, a motor, a ball screw and a ball screw seat etc. On the work tray 207 are placed magnetic head sliders 151 and flexures 155 fixed in a specific positional relationship therebetween. There are a plurality of magnetic head sliders 151 and flexures arranged side by side along the X direction on the work tray 207. The electrode bonding apparatus 200 also has means for holding the magnetic head slider 151 and the flexure 155 on the work tray 207 and means for detecting the position of the magnetic head slider 151 and the bonding head etc, but they will not be described since they have no direct relevancy to the present invention.

Figure 9:
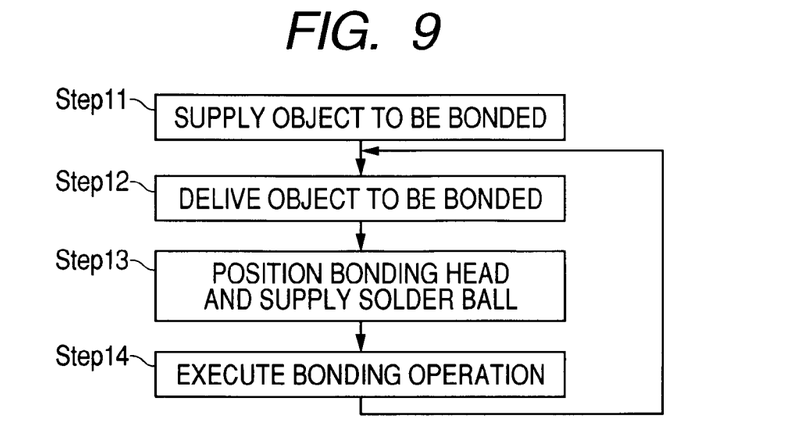
FIG. 9 is a flow chart of a process of bonding electrode in a magnetic head using the apparatus shown in FIG. 8.

In the following, an actual process of connecting or bonding electrodes using the electrode bonding apparatus 200 will be described with reference to the flow chart of FIG. 9. In the electrode bonding process, a work tray 207 on which a plurality of magnetic head sliders 151 and flexures 155 are placed side by side is set at a prescribed position on the work moving stage 205 (step 11). Subsequently, the work tray 207 is moved so that the magnetic head slider 151 and flexure 155 to be bonded first come into a prescribed positional relationship with the bonding head 1 at a predetermined operating position (step 12). Then, the positional relationship between the magnetic head slider 151 and flexure 155 to be bonded and the bonding head 1 is detected accurately by means of, for example, an image pickup apparatus or the like (not shown) that has an image pickup field that coincides with the axis of the laser beam. The first head moving stage 201 and the second head moving stage 203 are operated based on the detected positional relationship to position the bonding head 1 for bonding operation. Simultaneously, the conductive material supply portion 101 is driven so that a solder ball 117 is supplied to the bonding head 1 (step 13).

A solder ball 117 is supplied to a prescribed positions on the slider electrode and wiring electrode according to the process shown in the flow chart of FIG. 3, and the electrodes are bonded. Thereafter, the work tray 207 is moved in the X direction by the work moving stage 205 so that the magnetic head slider 151 and the flexure 155 that are to be bonded next are substantially brought into a prescribed positional relationship to the bonding head 1. Subsequently, the above described process is repeatedly performed, so that electrodes of all the magnetic head slider 151 and the flexures 155 placed on the work holder 207 are bonded. This bonding apparatus is merely an exemplary embodiment of the present invention, and various modifications can be made thereto. For example, the arrangement of the drive stages for the X, Y and Z directions and drive systems may be modified appropriately.

According to the present invention, in order to electrically connect an electrode of a magnetic head slider and a wiring electrode on a flexure that supports the slider in a process of manufacturing a miniaturized, high performance magnetic head, an electrically conductive material is supplied to the connecting portion. However, application of the present invention is not limited to the process of manufacturing such a magnetic head, but it can be applied to apparatuses used in various processes of connecting or bonding specific electrodes that are small and disposed close to each other.

This application claims priority from Japanese Patent Application No. 2006-258733 filed Sep. 25, 2006 which is hereby incorporated by reference herein.

What is claimed is:

1. A conductive material supply method for ejecting electrically conductive material to a prescribed portion between a plurality of electrodes and solidifying it to thereby electrically connect said plurality of electrodes, comprising the steps of:

transferring said electrically conductive material from a recessed portion to an interior space of a nozzle assembly with a first flow of gas of a first pressure introduced into the interior space of the nozzle assembly, said nozzle assembly includes a nozzle orifice through which said electrically conductive material is caused to pass and an interior space, the interior space being a substantially sealed space when said nozzle orifice is substantially closed by said electrically conductive material;

bringing said interior space into communication with an exterior space to relieve the first pressure after said electrically conductive material has been transferred into said interior space;

supplying a second flow of gas of a second pressure into said interior space;

closing said nozzle orifice substantially with said electrically conductive material with supply of said second gas being continued, thereby achieving a pressure close to said second pressure in said interior space; and ejecting said electrically conductive material to said prescribed portion by the effect pressure created by the second gas.

2. A conductive material supply method according to claim 1, wherein the state in which said nozzle orifice is substantially closed by said electrically conductive material is achieved by stopping transfer of said electrically conductive material by a block member that prevents said electrically conductive material from passing through said nozzle orifice, and when said block member opens, said electrically conductive material is ejected to said prescribed portion.

3. A conductive material supply method according to claim 1, wherein the step of bringing said interior space into communication with the exterior space comprises the step of opening a release valve connected to said interior space, and when supplying said second gas, said release valve is closed.

4. A conductive material supply method according to claim 1, wherein communication between said interior space and said exterior space is established by a needle valve connected to said interior space with which the flow rate of the gas flowing from said interior space to the exterior space can be controlled, and said needle valve is kept in an open state in which a constant gas flow rate is maintained both at the time when said first gas flows into said interior space and at the time when said second gas is supplied to said interior space.

5. A conductive material supply method according to claim 1, wherein said first gas and said second gas are an inert gas.

6. A conductive material supply method according to claim 1, wherein said first pressure and said second pressure are different from one another.

7. A conductive material supply method according to claim 1, wherein said first pressure is higher than said second pressure.

* * * * *